United States Patent
Higaki

(10) Patent No.: US 8,715,891 B2
(45) Date of Patent: May 6, 2014

(54) MASK AND PATTERN FORMING METHOD

(75) Inventor: Tomotaka Higaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 13/604,003

(22) Filed: Sep. 5, 2012

(65) Prior Publication Data
US 2013/0137015 A1    May 30, 2013

(30) Foreign Application Priority Data
Nov. 24, 2011   (JP) ................................. 2011-255970

(51) Int. Cl.
*G03F 1/44*    (2012.01)
*G03F 1/36*    (2012.01)

(52) U.S. Cl.
USPC .............................................. 430/5; 430/323

(58) Field of Classification Search
USPC ................. 430/5, 22, 322, 323, 394
See application file for complete search history.

(56) References Cited

U.S. PATENT DOCUMENTS

| | | | |
|---|---|---|---|
| 6,576,946 B1 | 6/2003 | Kanai et al. | |
| 8,107,215 B2 | 1/2012 | Lai | |
| 2009/0246648 A1* | 10/2009 | Yen et al. | 430/5 |
| 2012/0107729 A1* | 5/2012 | Blatchford et al. | 430/5 |

FOREIGN PATENT DOCUMENTS

| | | |
|---|---|---|
| JP | 2000-049306 | 2/2000 |
| JP | 2001-156263 | 6/2001 |
| JP | 2006-253709 | 9/2006 |
| JP | 2009-206427 | 9/2009 |
| JP | 2010-026416 | 2/2010 |
| JP | 2010-129740 | 6/2010 |

\* cited by examiner

*Primary Examiner* — Stephen Rosasco
(74) *Attorney, Agent, or Firm* — Finnegan, Henderson, Farabow, Garrett & Dunner, LLP

(57) ABSTRACT

According to one embodiment, a mask used with an exposure apparatus is disclosed. The mask includes a main pattern, and a sub-pattern having a dimension smaller than a resolution limit of the exposure apparatus. The sub-pattern is arranged next to the main pattern. The sub-pattern includes a first sub-pattern arranged next to the main pattern, and second sub-patterns contacting the first sub-pattern and arranged along a longitudinal direction of the first sub-pattern. The sub-patterns satisfy a condition of $P \leq \lambda/(NA(1+\sigma 0))$. Where P is a pitch of the second sub-patterns, NA is a numerical aperture of the exposure apparatus, $\lambda$ and $\sigma 0$ are respectively exposure wave length and maximum $\sigma$ when the main pattern by using the exposure apparatus.

20 Claims, 5 Drawing Sheets

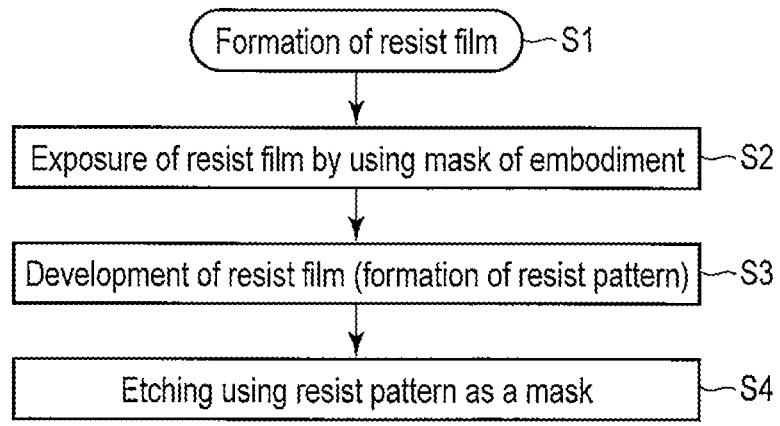
F I G. 5
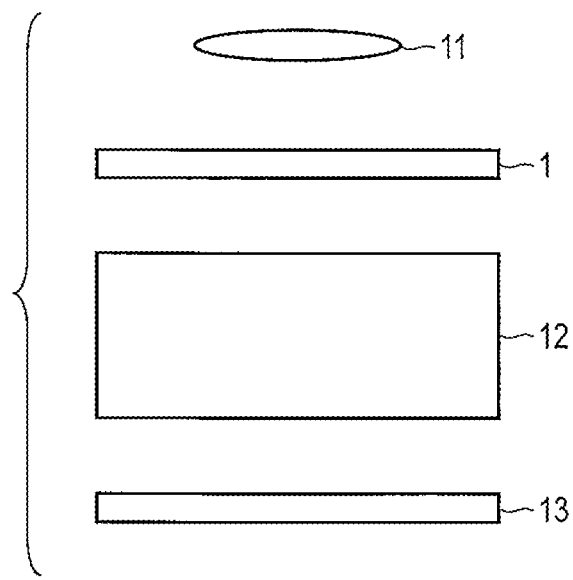
F I G. 6

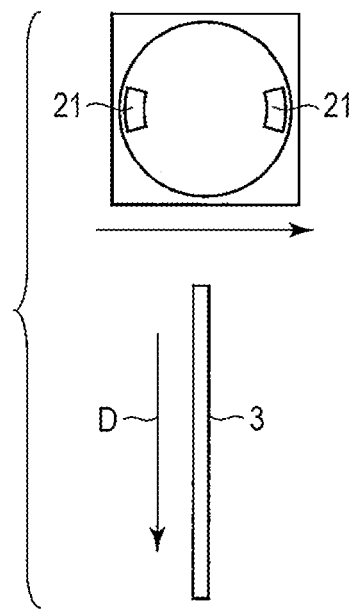
F I G. 7
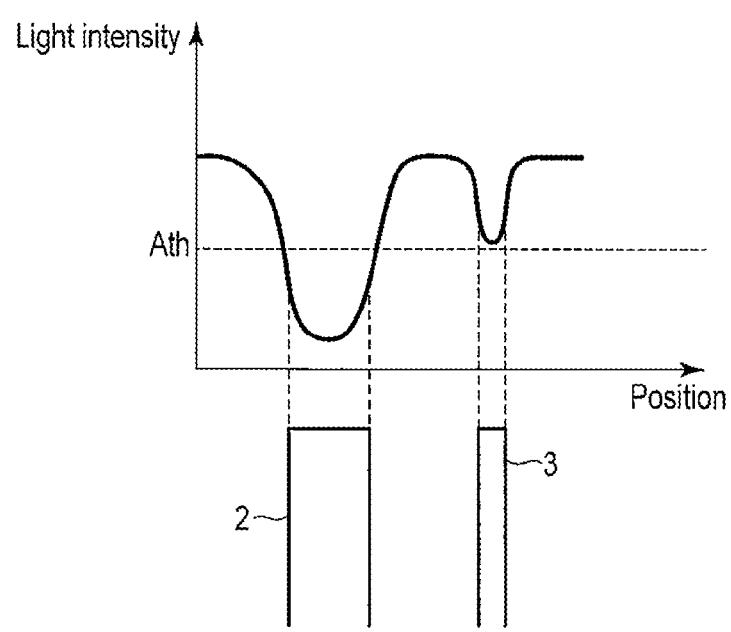
F I G. 8

MASK AND PATTERN FORMING METHOD

CROSS-REFERENCE TO RELATED APPLICATIONS

This application is based upon and claims the benefit of priority from Japanese Patent Application No. 2011-255970, filed Nov. 24, 2011, the entire contents of which are incorporated herein by reference.

FIELD

Embodiments described herein relate generally to a mask and pattern forming method used for a lithography process in a manufacturing method for a semiconductor device.

BACKGROUND

A mask pattern of a photomask used for manufacturing a semiconductor device is progressively miniaturized with miniaturization of device patterns. As one of the techniques for increasing the exposure latitude in a severe exposure condition, an SRAF (Sub Resolution Assist Feature) technique is known, which arranges a small pattern near the mask pattern, and the small pattern has a dimension smaller than the resolution limit.

A pattern used in SRAF (SRAF pattern) is smaller than a pattern to be transferred. Therefore, a processing technique for forming the SRAF pattern is important. In addition, a nondestructive pattern cleaning technique is also important to prevent destruction of a fine SRAF pattern during a cleaning step of the photomask.

At present, a strong chemical cleaning process cannot be applied to the photomask since materials of the mask pattern is limited. Therefore, a physical cleaning technique such as a mega-sonic cleaning technique, or a two-fluid cleaning technique is mainly used, where the mega-sonic cleaning technique applies ultrasonic waves to a solution which is obtained by adding additives to pure water based solvent, and the two-fluid cleansing technique cleans the photomask by high-speed and fine liquid particles which are obtained by applying high-pressure air to liquid.

By employing the physical cleaning technique, the cleaning process for the photomask having a thicker SRAF pattern may be performed. This enables preventing a destruction of the SRAF pattern while ensuring cleaning strength for the photomask.

However, the SRAF technique with the thicker SRAF pattern may fail to improve the transfer performance.

BRIEF DESCRIPTION OF THE DRAWINGS

FIG. 5 is a diagram for illustrating a pattern forming method according to a fifth embodiment;

FIG. 6 is a view schematically illustrating step S2 of the pattern forming method according to the fifth embodiment;

FIG. 7 is a view showing dipole illumination;

FIG. 8 is a diagram showing the light intensity distribution on a workpiece substrate of a comparison example;

DETAILED DESCRIPTION

There will now be described embodiments with reference to the drawings.

In general, according to one embodiment, a mask used with an exposure apparatus for implanting a pattern forming on a substrate is disclosed. The mask includes a main pattern corresponding to a pattern to be formed on the substrate; and a sub-pattern which has a dimension smaller than a resolution limit of the exposure apparatus and is arranged next to the main pattern. The sub-pattern includes a first sub-pattern arranged next to the main pattern and having a longitudinal direction, and a plurality of second sub-patterns configured to contact the first sub-pattern and configured to be arranged along the longitudinal direction of the first sub-pattern. The sub-pattern satisfies a condition of $P \leq \lambda/(NA(1+\sigma_0))$. Here, P is an arrangement pitch of the second sub-patterns, NA is a numerical aperture of the exposure apparatus, $\lambda$ is an exposure wavelength when the main pattern is transferred by using the exposure apparatus and $\sigma_0$ is the maximum $\sigma$ when the main pattern is transferred by using the exposure apparatus.

According to one embodiment, a pattern forming method is disclosed. The pattern forming method includes exposing a resist film on a substrate by using a mask; forming a resist pattern by developing the exposed resist film; and etching the substrate by using the resist pattern as a mask. The mask includes a main pattern corresponding to a pattern to be formed on the substrate; and a sub-pattern which has a dimension smaller than an resolution limit of the exposure apparatus and is arranged next to the main pattern. The sub-pattern includes a first sub-pattern arranged next to the main pattern and having a longitudinal direction, and a plurality of second sub-patterns configured to contact the first sub-pattern and configured to be arranged along the longitudinal direction of the first sub-pattern. The sub-pattern satisfies a condition of $P \leq \lambda/(NA(1+\sigma_0))$. Here, P is an arrangement pitch of the second sub-patterns, NA is a numerical aperture of the exposure apparatus, $\lambda$ is an exposure wavelength when the main pattern is transferred by using the exposure apparatus and $\sigma_0$ is the maximum $\sigma$ when the main pattern is transferred by using the exposure apparatus.

(First Embodiment)

Figure 1:
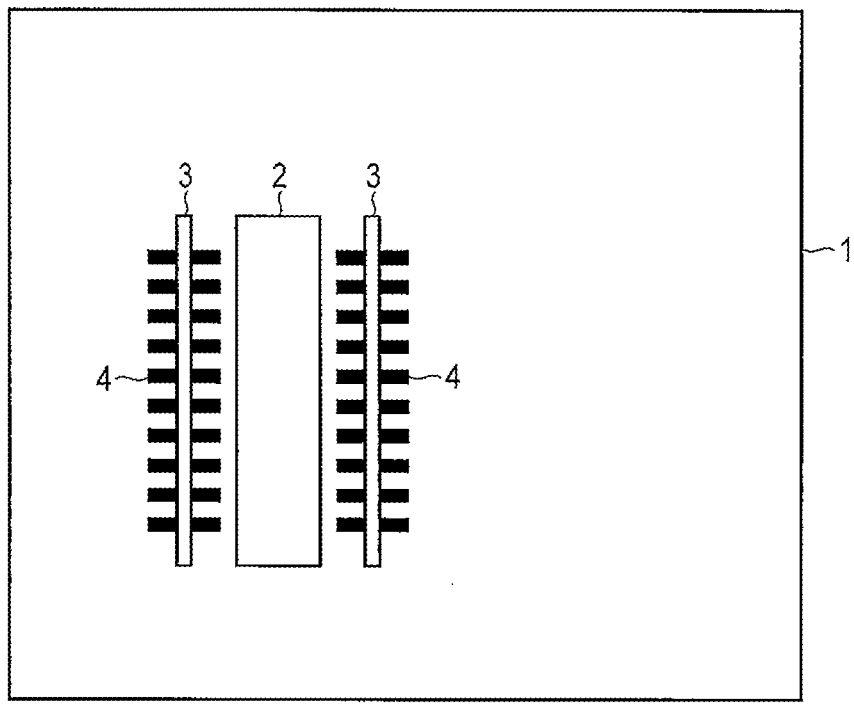
FIG. 1 is a plan view schematically showing a photomask according to a first embodiment.

FIG. 1 is a plan view schematically showing a photomask according to a first embodiment. The photomask of the present embodiment is used for a lithography process in a manufacturing method for a semiconductor device. The photomask of the present embodiment is, for example, a mask after a half pitch (HP) 30-nm generation. This value is a value on the mask.

The photomask of the present embodiment comprises a transparent substrate 1, and a pattern 2 provided on the transparent substrate 1. The pattern 2 corresponds to a pattern to be formed on a workpiece substrate. The above pattern is, for example, a device pattern or dummy pattern. The photomask further comprises a first SRAF pattern (first sub-pattern) 3 and a plurality of second SRAF patterns (second sub-patterns) 4. The first SRAF pattern 3 is arranged near the main pattern 2. For example, the first SRAF pattern 3 is arranged within a range of the proximity effect. The first SRAF pattern 3 has a line form with a dimension less than a resolution limit. The plurality of second SRAF patterns 4 are in contact with the first SRAF pattern 3, and arranged at right angles to the line of the SRAF pattern 3. The plurality of second SRAF patterns 4 have rectangular forms with the dimension less than the resolution limit.

In the case of the present embodiment, the following condition is satisfied.

$$P \leq \lambda/(NA(1+\sigma_0)) \quad (1)$$

where NA is a numerical aperture of an exposure apparatus, $\lambda$ is an exposure wavelength pattern when the main pattern 2 is transferred by using the exposure apparatus and $\sigma_0$ is the maximum $\sigma$ of illumination when the main pattern 2 is transferred by using the exposure apparatus.

Figure 9:
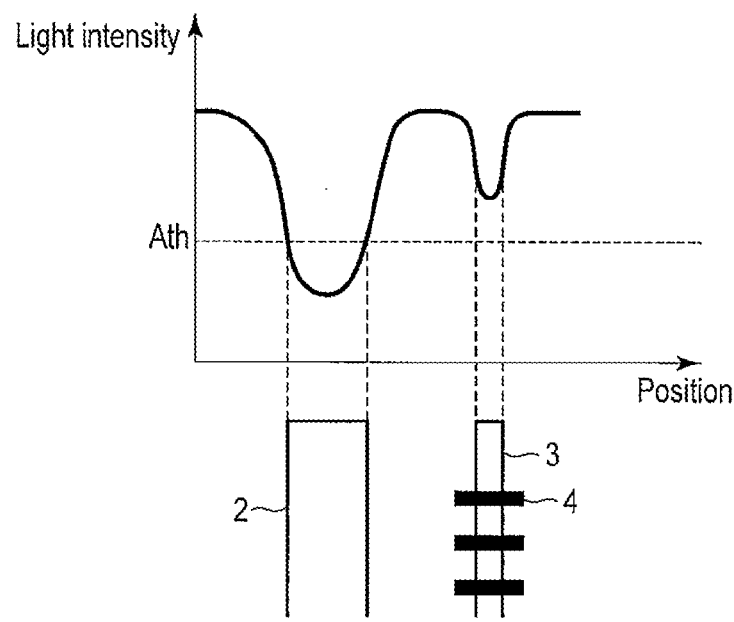
FIG. 9 is a diagram showing the light intensity distribution on a workpiece substrate of an embodiment.

When the expression (1) is satisfied, it is understood that the SRAF patterns 3, 4 do not have influence on a resolution performance of the main pattern 2 to be transferred as will be described later (FIG. 8, FIG. 9). Further, when the expression (1) is satisfied, it is understood that the above influence can be effectively suppressed if the illumination by the exposure apparatus is dipole illumination or orthogonal illumination.

For example, the first and second SRAF patterns 3, 4 comprise a Mo/Si.

FIG. 1 illustrates a layout of patterns that two first SRAF patterns 3 are arranged near the two sides of one line-form main pattern 2. In practice, a larger number of main patterns (mask patterns) are present, but they are not shown for simplicity. Further, the shape and the number of second SRAF patterns can be adequately modified.

The first SRAF pattern 3 is a main SRAF pattern. Therefore, even when a part of the second SRAF patterns 4 is lost (destroyed) at the time of cleaning or the like, the function as SRAF can be maintained in some cases.

According to the present embodiment, when the photomask is cleaned by use of a known physical cleaning technique such as a mega-sonic cleaning technique or two-fluid cleaning technique, the mechanical strength of one line-form first SRAF pattern 3 is enhanced by the second SRAF patterns 4 arranged in contact with the SRAF pattern 3. Therefore, even after the photomask is sufficiently cleaned by use of the physical cleaning technique, the effect of the SRAF pattern can be maintained. Thus, according to the present embodiment, a mask that can be cleaned without losing the transferability can be provided.

(Second Embodiment)

Figure 2:
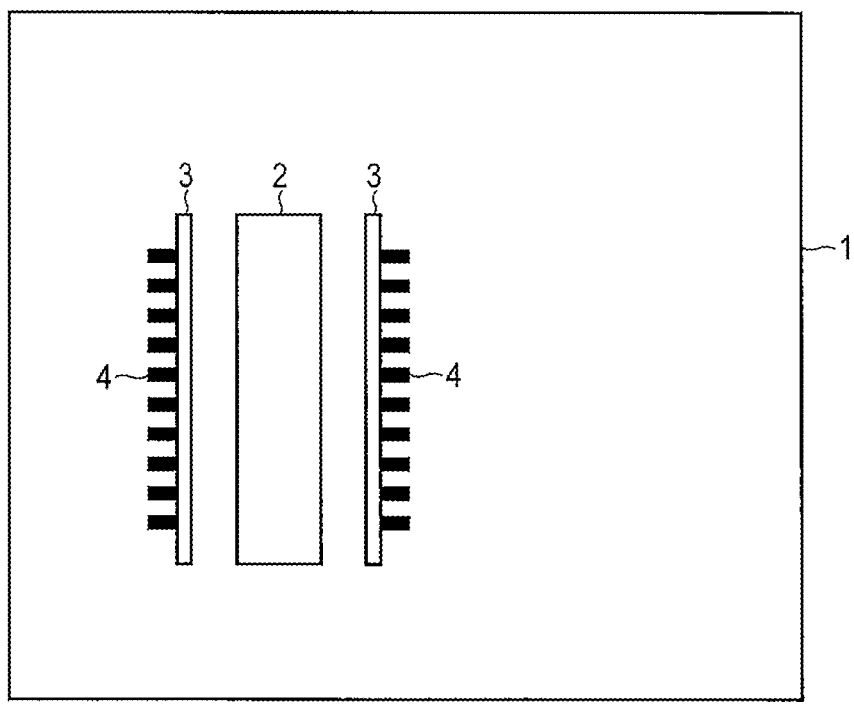
FIG. 2 is a plan view schematically showing a photomask according to a second embodiment.

FIG. 2 is a plan view schematically showing a photomask according to a second embodiment. In the following figures, portions corresponding to the previously shown portions are denoted by the same reference numerals and omitted its detail explanation.

The photomask of the present embodiment has a configuration same as the photomask of the first embodiment except that the second SRAF patterns 4 contacting the sides of the first SRAF patterns 3 facing the main pattern 2 are omitted.

Like the first embodiment, in the present embodiment, the effect of the SRAF pattern can be maintained even after the photomask is sufficiently cleaned by use of the physical cleaning technique.

(Third Embodiment)

Figure 3:
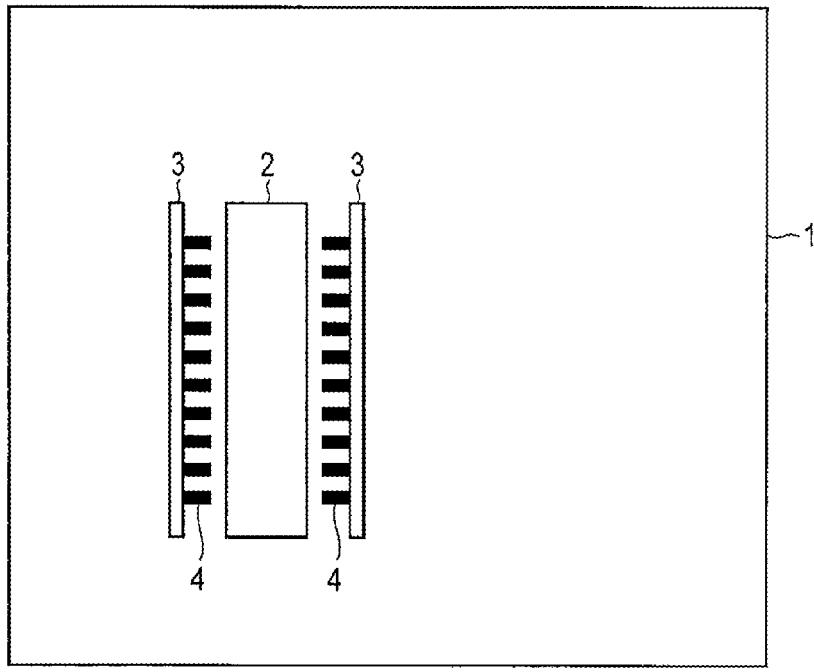
FIG. 3 is a plan view schematically showing a photomask according to a third embodiment.

FIG. 3 is a plan view schematically showing a photomask according to a third embodiment.

On the contrary to the second embodiment, the photomask of the present embodiment has a configuration that the second SRAF patterns 4 contacting the sides of the first SRAF patterns 3 facing the main pattern 2 are left.

Like the first embodiment, in the present embodiment, the effect of the SRAF pattern can be maintained even after the photomask is sufficiently cleaned by use of the physical cleaning technique.

(Fourth Embodiment)

Figure 4:
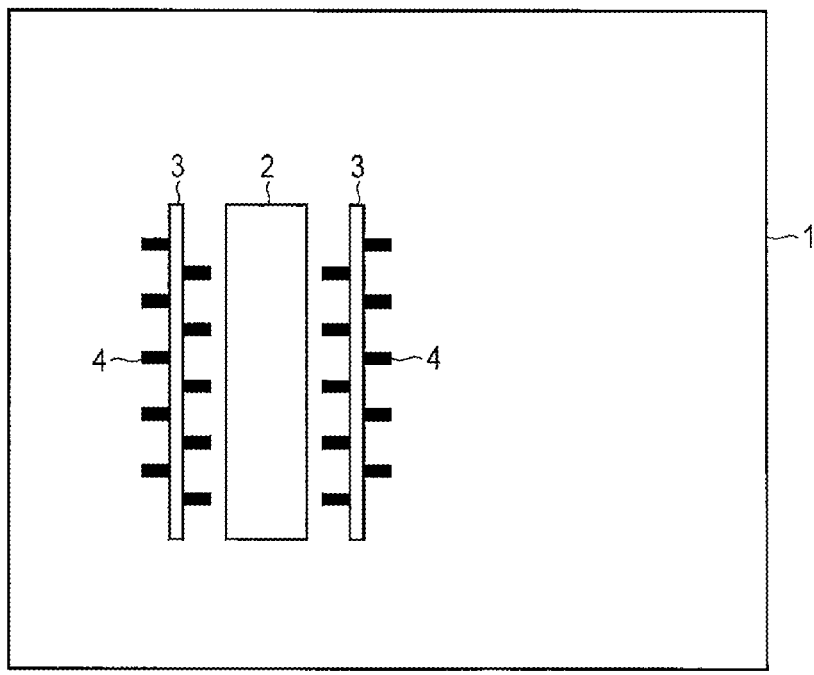
FIG. 4 is a plan view schematically showing a photomask according to a fourth embodiment.

FIG. 4 is a plan view schematically showing a photomask according to a fourth embodiment.

The present embodiment is different from the first embodiment in that second SRAF patterns 4 are alternately arranged on right and left sides of each of the first SRAF patterns 3 in the longitudinal direction thereof.

Like the first embodiment, in the present embodiment, the effect of the SRAF pattern can be maintained even after the photomask is sufficiently cleaned by use of the physical cleaning technique.

(Fifth Embodiment)

FIG. 5 is a flow diagram for illustrating a pattern forming method according to a fifth embodiment.

[Step S1]

A resist film is formed on a workpiece substrate.

[Step S2]

The resist film on the workpiece substrate is exposed by using the photomask of the first embodiment. The explanation of the present embodiment is directed to a case where the photomask of the first embodiment is used, but the same explanation is applicable to cases where the photomask of the second to fourth embodiments are used.

FIG. 6 is a view schematically showing step S2. In FIG. 6, 11 indicates an illumination optical system, 1 indicates the photomask of the embodiment, 12 indicates a projection optical system and 13 indicates the workpiece substrate. A resist film (not shown) is formed on the workpiece substrate 13.

A pattern formed on the photomask is transferred onto the resist film on the workpiece substrate 13 via the projection optical system 12 by using light of the illumination optical system 11 in which a shape distribution of an effective light source is defined.

In the illumination optical system 11 of the present embodiment, dipole illumination (dual pole illumination) shown in FIG. 7 is used. In FIG. 7, 21 indicates an exposure illumination opening. In the present embodiment, the mask is illuminated with light by setting a direction of two pupils (exposure illumination openings 21) of the dipole illumination perpendicular to a longitudinal direction D of the first SRAF pattern 3.

In this case (dipole illumination, orthogonal illumination), it become apparent that the plurality of second SRAF patterns 4 do not have influence on the resolution performance of the main pattern 2 (pattern to be transferred) by adequately setting a pitch of the plurality of second SRAF patterns 4. The reason is considered as follows.

FIG. 8 is a diagram showing the light intensity distribution on a workpiece substrate in a case where a photomask has no second SRAF patterns and a dipole illumination is used (comparison example). FIG. 9 is a diagram showing the light intensity distribution on a workpiece substrate in a case where a photomask has second SRAF patterns and dipole illumination is used (embodiment). Ath on the ordinate of FIG. 8, FIG. 9 indicates the minimum value (threshold value) of the light intensity necessary for permitting positive resist to be dissolved in a development process.

As is seen from FIG. 8, in the case of the comparison example, it is understood that positive resist in a region corresponding to the main pattern 2 is not dissolved in a development process and positive resist in a region corresponding to the SRAF pattern 3 is dissolved in the development process. That is, it is understood that the SRAF pattern 3 does not have influence on the resolution performance of the main pattern 2 to be transferred.

As is seen from FIG. 9, in the case of the embodiment, it is understood that positive resist in a region corresponding to the main pattern 2 is not dissolved in a development process and positive resist in regions corresponding to the first and second SRAF pattern 3, 4 is dissolved in the development process. That is, it is understood that the SRAF patterns 3, 4 do not have influence on the resolution performance of the main pattern 2 to be transferred.

As is seen from FIG. 8 and FIG. 9, it is understood that the light intensity distribution obtained by upwardly shifting the light intensity distribution of the comparison example corresponds to the light intensity distribution of the embodiment and the light intensity distribution of the embodiment is obtained by offsetting the light intensity distribution of the comparison example. This is considered as a reason that the resolution characteristic of the main pattern 2 (pattern to be transferred) is not influenced even if the plurality of second SRAF patterns 4 are present.

[Step S3]

Following the step S2 (exposure), a resist pattern is formed on the workpiece substrate by developing the exposed resist film.

[Step S4]

The workpiece substrate is etched with the resist pattern used as a mask to form a pattern.

At this time, if the underlying layer (the uppermost layer of the workpiece substrate) of the resist film is a polysilicon film or metal film, a fine electrode pattern, wiring pattern or the like is formed. If the underlying layer (the uppermost layer of the workpiece substrate) of the resist film is an insulating film, a fine contact hole pattern, gate insulating film or the like is formed. Further, if the underlying layer of the resist film is a semiconductor substrate (wafer), a fine isolation trench (STI) or the like is formed.

A semiconductor device is formed by repeatedly performing the formation of resist film (step S1), the exposure of the resist film (step S2), the formation of resist pattern (step S3) and etching of a workpiece substrate to form a necessary pattern.

Figure 10:
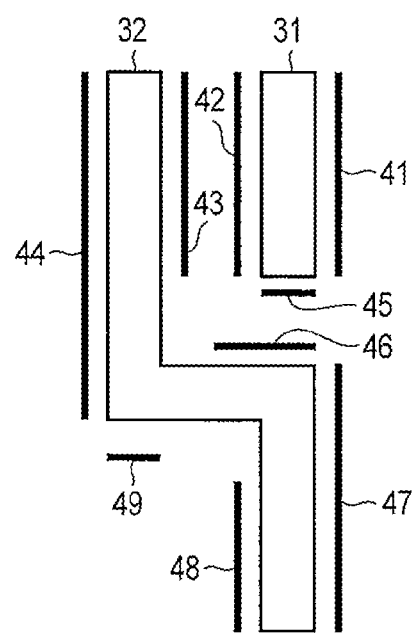
FIG. 10 is a plan view schematically showing another mask pattern to which an embodiment is applied.

The main pattern to which the present embodiment can be applied is not particularly limited and, for example, main patterns 31, 32 shown in FIG. 10 may be used. In this case, as shown in FIG. 10, SRAF patterns 41 to 48 are arranged. The SRAF patterns 41 to 48 respectively include the first and second SRAF patterns explained in the first embodiment, but only one pattern is shown for simplicity. Further, all of the SRAF patterns 41 to 48 are not necessarily required to include the first and second SRAF patterns.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask used with an exposure apparatus for implementing a pattern forming on a substrate, the mask comprising:
    a main pattern corresponding to a pattern to be formed on the substrate; and
    a sub-pattern which has a dimension smaller than a resolution limit of the exposure apparatus and which is arranged next to the main pattern,
    the sub-pattern comprising
    a first sub-pattern arranged next to the main pattern and having a longitudinal direction, and
    a plurality of second sub-patterns configured to contact the first sub-pattern and configured to be arranged along the longitudinal direction of the first sub-pattern,
    and the sub-pattern is configured to satisfy a condition of $P \leq \lambda/(NA(1+\sigma_0))$, where P is an arrangement pitch of the plurality of second sub-patterns, NA is a numerical aperture of the exposure apparatus, $\lambda$ is an exposure wavelength when the main pattern is transferred by using the exposure apparatus and $\sigma_0$ is maximum $\sigma$ when the main pattern is transferred by using the exposure apparatus.

2. The mask according to claim 1, wherein the main pattern comprises a line pattern,
    the first sub-pattern has a line form,
    the plurality of second sub-patterns have rectangular forms,
    the first sub-pattern is arranged next to the line pattern such that the longitudinal direction of the first sub-pattern is coincident with a longitudinal direction of the line pattern,
    one side of each of the plurality of second sub-patterns contacts a long side of the first sub-pattern, and the plurality of second sub-patterns are arranged along the longitudinal direction of the first sub-pattern.

3. The mask according to claim 1, wherein the exposure apparatus is configured to perform a dipole illumination, or an orthogonal illumination.

4. The mask according to claim 1, wherein the plurality of second sub-patterns are configured to enhance mechanical strength of the first sub-pattern subjected to physical cleaning.

5. The mask according to claim 4, wherein number and layout positions of the plurality of second sub-patterns are determined to enhance the mechanical strength of the first sub-pattern subjected to the physical cleaning.

6. The mask according to claim 1, wherein the main pattern comprises a device pattern.

7. The mask according to claim 1, wherein the main pattern comprises a dummy pattern.

8. The mask according to claim 1, wherein the sub-pattern is an SRAF (Sub Resolution Assist Feature) pattern.

9. The mask according to claim 1, wherein the main pattern comprises a first line pattern,
    the first sub-pattern comprises a second line pattern whose width is smaller than that of the first line pattern, the second line pattern is arranged next to the first line pattern to have a same longitudinal direction as the longitudinal direction of the first line pattern,
    the plurality of second sub-patterns comprises a plurality of first rectangular patterns and a plurality of second rectangular patterns,
    the plurality of first rectangular patterns contact one long side of the second line pattern and the plurality of first rectangular patterns are arranged along the longitudinal direction of the second line pattern, and
    the plurality of second rectangular patterns contact the other long side of the second line pattern and the plurality of second rectangular patterns are arranged along the longitudinal direction of the second line pattern.

10. The mask according to claim 1, wherein the main pattern comprises a first line pattern,
    the first sub-pattern comprises a second line pattern whose width is smaller than that of the first line pattern, the second line pattern is arranged next to the first line pattern to have a same longitudinal direction as the longitudinal direction of the first line pattern, the plurality of second sub-patterns comprises a plurality of rectangular patterns, the plurality of rectangular patterns contact one long side of the second line pattern and the plurality of rectangular patterns are arranged along the longitudinal direction of the second line pattern.

11. The mask according to claim 1, wherein the main pattern comprises a first line pattern, the first sub-pattern comprises a second line pattern whose width is smaller than that of the first line pattern, the second line pattern is arranged next to the first line pattern to have a same longitudinal direction as the longitudinal direction of the first line pattern, the plurality of second sub-patterns comprise a plurality of rectangular patterns, the second line pattern has a first long side that faces the first line pattern and a second long side on an opposite side of the first long side, the plurality of rectangular patterns contact the second long side of the second line pattern and the plurality of rectangular patterns are arranged along the longitudinal direction of the second line pattern.

12. The mask according to claim 1, wherein the main pattern comprises a first line pattern, the first sub-pattern comprises a second line pattern whose width is smaller than that of the first line pattern, the second line pattern is arranged next to the first line pattern to have a same longitudinal direction as the longitudinal direction of the first line pattern, the plurality of second sub-patterns comprise a plurality of rectangular patterns, the second line pattern has a first long side that faces the first line pattern and a second long side on an opposite side of the first long side, the plurality of rectangular patterns contact the first long side and the plurality of rectangular patterns are arranged along the longitudinal direction of the second line pattern.

13. The mask according to claim 1, wherein the main pattern comprises a first line pattern, the first sub-pattern comprises a second line pattern whose width is smaller than that of the first line pattern, the second line pattern is arranged next to the first line pattern to have the same longitudinal direction as the longitudinal direction of the first line pattern, the plurality of second sub-patterns comprises a plurality of rectangular patterns, the second line pattern has a first long side that faces the first line pattern and a second long side on an opposite side of the first long side, the plurality of first rectangular patterns contact the first long side and the plurality of first rectangular patterns are arranged along the longitudinal direction of the second line pattern, the plurality of second rectangular patterns contact the second long side and the plurality of second rectangular patterns are arranged along the longitudinal direction of the second line pattern, and the first and second rectangular patterns are alternately arranged along the longitudinal direction of the second line pattern.

14. A pattern forming method comprising:

exposing a resist film on a substrate by using a mask;

forming a resist pattern by developing the exposed resist film; and etching the substrate by using the resist pattern as a mask, the mask comprising:

a main pattern corresponding to a pattern to be formed on the substrate; and a sub-pattern which has a dimension smaller than a resolution limit of the exposure apparatus and which is arranged next to the main pattern, the sub-pattern comprising a first sub-pattern arranged next to the main pattern and having a longitudinal direction, and a plurality of second sub-patterns configured to contact the first sub-pattern and configured to be arranged along the longitudinal direction of the first sub-pattern, and the sub-pattern is configured to satisfy a condition of $P \leq \lambda/(NA(1+\sigma_0))$, where P is an arrangement pitch of the plurality of second sub-patterns, NA is a numerical aperture of the exposure apparatus, $\lambda$ is an exposure wavelength when the main pattern is transferred by using the exposure apparatus and $\sigma_0$ is maximum $\sigma$ when the main pattern is transferred by using the exposure apparatus.

15. The pattern forming method according to claim 14, wherein the substrate comprises a conductive film, and the etching the substrate results in forming a pattern comprising the conductive film.

16. The pattern forming method according to claim 15, wherein the conductive film is a semiconductor film or a metal film.

17. The pattern forming method according to claim 15, wherein the pattern comprising the conductive film is an electrode pattern, or a wiring pattern.

18. The pattern forming method according to claim 14, wherein the substrate comprises an insulating film, and the etching the substrate results in forming a contact pattern penetrating the insulation film, or forming a gate insulating film comprising the insulating film.

19. The pattern forming method according to claim 14, wherein the substrate comprises a semiconductor substrate, and the etching the substrate results in forming a trench.

20. The pattern forming method according to claim 14, wherein the exposure apparatus is configured to perform a dipole illumination, or an orthogonal illumination.

* * * * *